US006608493B2

(12) United States Patent
Hensler et al.

(10) Patent No.: US 6,608,493 B2
(45) Date of Patent: Aug. 19, 2003

(54) PORTABLE TESTING DEVICE

(75) Inventors: Thomas Hensler, Klaus (AT); Reinhard Kaufmann, Thüringerberg (AT); Ulrich Klapper, Feldkirch (AT); Michael Krüger, Zwischenwasser (AT); Zeljko Schreiner, Lindau (DE)

(73) Assignee: Omicron Electronics GmbH, Klaus (AU)

( * ) Notice: Subject to any disclaimer, the term of this patent is extended or adjusted under 35 U.S.C. 154(b) by 0 days.

(21) Appl. No.: 09/969,931

(22) Filed: Oct. 3, 2001

(65) Prior Publication Data
US 2002/0057091 A1 May 16, 2002

(30) Foreign Application Priority Data
Oct. 4, 2000 (DE) .......................... 100 48 962

(51) Int. Cl.⁷ .................. G01R 27/08; G01R 31/02; G01N 27/02
(52) U.S. Cl. .................. 324/713; 324/72; 324/439; 324/444
(58) Field of Search ............... 324/713, 502, 324/705, 72, 74, 439, 444; 330/124 R, 127; 323/312, 273, 222; 363/19–21, 16

(56) References Cited

U.S. PATENT DOCUMENTS

| 4,429,269 A | * | 1/1984 | Brown ............... 323/301 |
| 4,464,709 A | * | 8/1984 | Barter ............... 363/16 |
| 4,652,830 A | * | 3/1987 | Brown ............... 324/439 |
| 4,797,541 A | * | 1/1989 | Billings et al. ............. 235/449 |
| 5,350,997 A | * | 9/1994 | Ghotbi et al. ............. 323/268 |
| 5,600,255 A |   | 2/1997 | Moore et al. ............. 324/715 |
| 5,815,380 A | * | 9/1998 | Cuk et al. ............... 363/16 |
| 5,821,742 A | * | 10/1998 | Carr et al. ............. 324/74 |
| 5,974,362 A | * | 10/1999 | Owen ............... 702/107 |
| 6,043,636 A | * | 3/2000 | Gaudreau et al. ........... 323/282 |
| 6,255,906 B1 | * | 7/2001 | Eidson et al. ........... 330/124 R |
| 6,285,251 B1 | * | 9/2001 | Dent et al. ............. 330/127 |
| 6,359,450 B1 | * | 3/2002 | Zabler et al. ............ 324/713 |

FOREIGN PATENT DOCUMENTS

| DE | 2632377 |   | 1/1978 |
| DE | 3822990 |   | 1/1990 |
| DE | 19519746 |   | 12/1996 |
| JP | 550162215 | * | 2/1980 | ........... G01R/31/00 |

* cited by examiner

Primary Examiner—N. Le
Assistant Examiner—Wasseem H. Hamdan
(74) Attorney, Agent, or Firm—McDonnell Boehnen Hulbert & Berghoff

(57) ABSTRACT

There is described a fully automatic portable testing device which can be used generally for testing test-pieces to be operated at high voltages and/or high currents, such as current or voltage transducers or transformers for example. For this purpose, the portable testing device comprises a switched-mode power amplifier (3) whose output is connected to a matching transformer (4–7) having a plurality of secondary windings (5–7), which can be changed over. The test-piece on which measurements are to be made is in each case removably connected to the secondary windings (5–7) of the matching transformer. The portable testing device also comprises a control which in particular may have a digital signal processor (8) and/or a controller or computer (9) and which on the one hand controls the power amplifier (3) in a purposive way and preferably also performs an automatic changeover of the secondary windings (5–7) of the matching transformer, in order to generate a desired testing signal. The control (8, 9) also analyses the measurement signals that are set up as a result of a test. In this way, a compact and easily transportable tester is made available which is versatile in application.

24 Claims, 1 Drawing Sheet

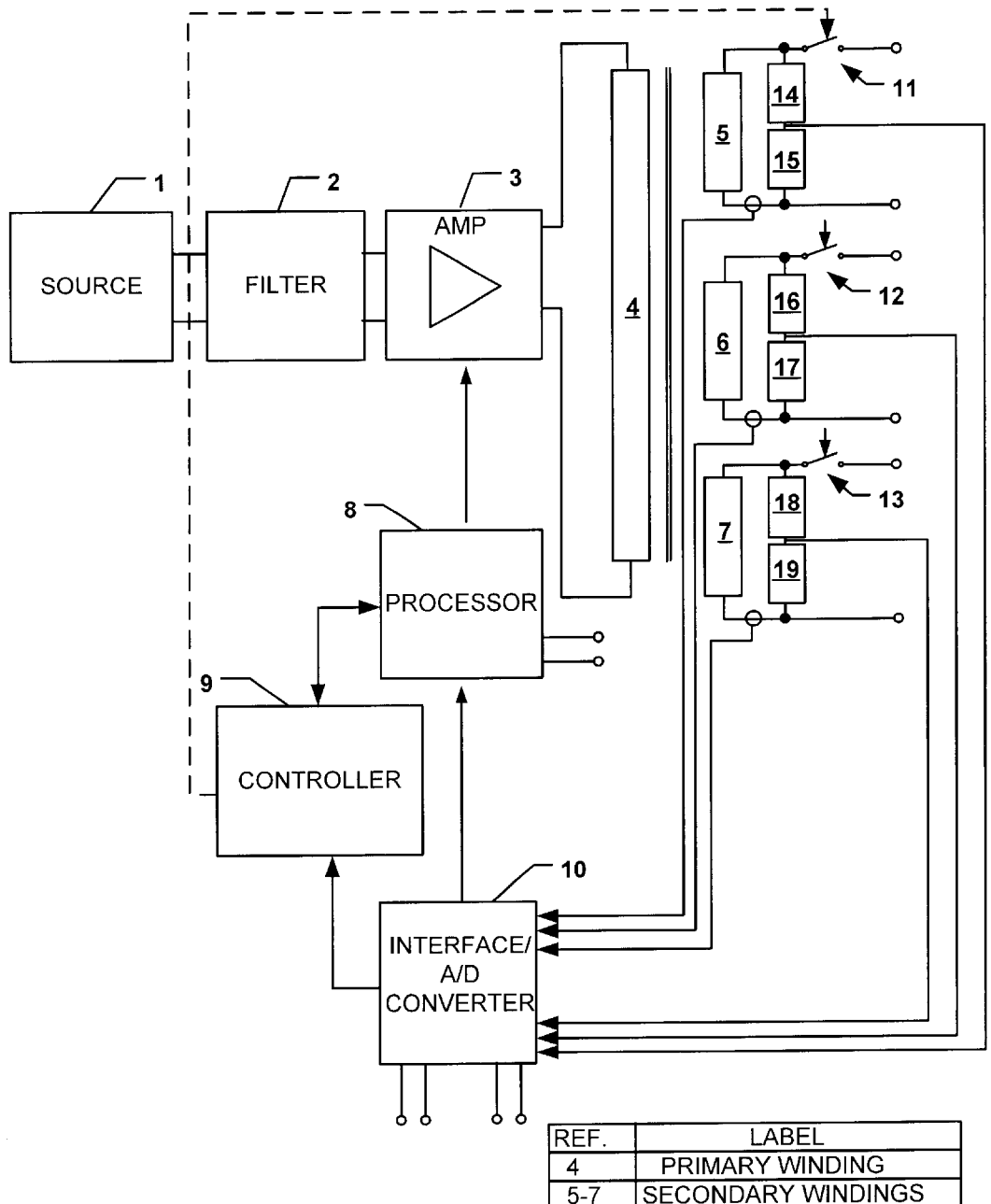

PORTABLE TESTING DEVICE

CROSS-REFERENCE TO RELATED APPLICATIONS

This application claims foreign priority benefits of German priority document DE 100 48 962.1, filed on Oct. 4, 2000, and entitled "Portable testing device for testing test-pieces operated at high voltages and/or currents" (translated and amended) to Hensler et al., the disclosure of which is incorporated by reference in its entirety.

FIELD

The present invention relates to a portable testing device for testing test-pieces operated at high voltages and/or high currents, such for example as high-voltage or high-current transformers, over-current relays or the like.

BACKGROUND

Previous transportable testers that are able to supply high currents and voltages almost always constitute individual solutions for specific applications. High-current sources, for example, are known for measuring the transformation ratio of current transformers and for testing over-current relays. Also known are voltage sources for testing voltage transformers and for plotting current transformer magnetization curves, and $\mu\Omega$ measuring bridges or $m\Omega$ measuring bridges.

Transportable testers giving output currents of up to a few amps and output voltages of up to a few kilovolts at an output power of up to a few kilovolt-amperes are currently all still constructed using conventional 50 Hz techniques. In this case, the testing signal, i.e. the testing current or testing voltage, is set manually or by a motor using a variable transformer. The testing signals supplied by the given tester depend on the waveform of the mains voltage, and where the test-pieces are non-linear, on the voltage-dependent impedance of the test-piece as well. This is an important factor when for example magnetization curves are being plotted on current transformers. In this case, the amplitude of the testing signal changes as a function of the mains voltage and the load. With standard commercial testers employing manually operated variable transformers it is also not possible to perform automatic test sequences giving repeatable measurements. Repetitive testing operations, such as the plotting of magnetization curves on transformers of identical design for example, therefore have to be carried out by qualified personnel, and this takes time.

To generate usable testing currents and testing voltages, the conventional practice is often to use power amplifiers but these are large, heavy, and expensive. Conventional power amplifiers of this kind are not suitable for light, transportable testing devices and what in fact need to be found in this case are solutions that are optimized in respect of weight and the space they take up.

Another problem that is found with conventional testing devices is that the measurements acquired by the testing device during a measuring operation can generally only be recorded by hand. Particularly when electrical systems are being commissioned, it is necessary for the tests to be properly documented. Occasionally the testers are also provided with a small printer or a PC interface. However, no complete solution for the automatic generation of a test record is known for primary tests.

It is clear from what is said above that there is a great need for a transportable testing device that is capable of being used flexibly and is not confined to specific applications, but in principle, can be used for testing various different power-engineering test-pieces operated at high currents and/or high voltages as desired.

SUMMARY

The portable testing device according to the invention comprises a controllable converter device, in the form of a (switched-mode) power amplifier or power converter for example, which is to be connected to a source of supply voltage such as to the mains voltage for example. The portable testing device according to the invention further comprises a matching transformer having a plurality of switchable secondary windings to which a rest-piece on which measurements are to be made is removably connected. Also provided are control means which on the one hand control the controllable converter device in such a way that a desired testing signal is applied to the test-piece via the matching transformer or is fed to the test-piece, and which on the other hand acquire and preferably also evaluate analog or digital measurement signals which in each case define a measured parameter of the test-piece which adjusts itself in response to the testing signal generated. For this purpose, the control means may comprise a controller and/or a computer and/or a digital signal processor.

The above-mentioned control means may be so designed that they perform the appropriate test sequences automatically as a function of specific preset test procedures and for this purpose automatically control the controllable converter device and/or the matching transformer. The measurements obtained as a result of a test can be stored in the testing device itself, so that a test record is automatically produced for each tests which, via a suitable interface, can also be downloaded by an external computer. In addition to this, each test record can preferably serve at the same time as a master or template for a further test in which similar test-pieces are to be tested. Such test procedures can be stored in the device concerned beforehand or can be created by means of suitable input means such as a keyboard combined with a display unit. It is also conceivable for the desired test procedures to be downloaded from an external computer into the portable tester via a suitable interface.

The use of a digital signal processor makes it possible for a testing signal which in principle can be as desired to be applied to the test-piece which is connected at the time by controlling the controllable converter device in a suitable way. The use of a digital signal processor also ensures that the acquisition of the measurement signal can take place synchronously with the generation of the testing signal, so that it is possible for tests to be conducted in real time.

The control means of the portable testing device according to the invention are preferably so designed that they close a regulating circuit for regulating the testing signal emitted via the matching transformer. By monitoring the voltage or current in the secondary windings of the matching transformer, the voltage or current value of the testing signal emitted is regulated to a preset value and made independent of fluctuations in mains voltage. What is also possible is regulation where a sinusoidal testing signal is generated even when the impedance of the test-piece connected to the matching transformer is not linear.

It is particularly advantageous if the testing signal generated by the portable testing device is generated in synchronization with a given reference signal, such as the mains voltage for example. When this is the case it is even conceivable to have a large-scale testing system having a number of testing devices according to the invention which can be jointly synchronized via the same reference signal, via for example the mains voltage, a given control voltage or a GPS (global positioning system) signal.

In the context of the present invention, there is thus proposed a fully automatic portable testing device that can supply both high currents and high voltages. For this purpose, one or more internal sources which are formed by the previously described converter device are connected to at least one matching transformer which is capable of being changed over and which on the one hand provides electrical isolation on the output side and on the other is responsible for matching the amplifier output of the internal source concerned to the high-current or high-voltage circuit connected to the matching transformer. If the controllable converter device comprises a switched-mode power amplifier as the internal current or voltage source, the power amplifier preferably supplies an output voltage of 250 V and an output current of 20 A for example which is matched to the relevant high-current circuit (e.g. 5 V, 1000 A) or high-voltage circuit (e.g. 2000 V, 2.5 A) by means of the matching transformer. The particular reason for which this scheme is possible is because either high testing currents or high testing voltages are needed for testing current converters or transformers, voltage converters or transformers, industrial amplifiers, etc. in commissioning tests on power stations, transformer substations or the like, but not high testing currents and high testing voltages at the same time. The testing currents or voltages supplied by the portable testing device can have their amplitude and phase shift for example freely programmed by the control means described above, which can also comprise an externally connectable control.

By means of the portable testing device according to the invention, both a high-current source for direct and alternating current and a high-voltage source and a preferably multi-channel measuring means are incorporated in a compact and easily transportable device, in which case the measuring means can be designed to measure voltages, currents, phase angles, powers, resistances, tripping times and the like. Rather than a variable transformer, a switched-mode power amplifier is preferably used to generate the desired testing signal, in which case the testing can be controlled by the above-mentioned control means and testing sequences which would otherwise have to be performed manually at some expense in terms of time can take place fully automatically (such as the plotting of magnetization curves of current transformers). What is more, such a power amplifier, if appropriately controlled, makes it possible even for non-sinusoidal testing signals and harmonics to be generated, which is advantageous for estimating response characteristics at fairly higher frequencies for example. It is also possible for non-symmetrical testing signals to be generated to test the polarity of the wiring of the test-piece. At the same time the portable testing device proposed in the context of the present invention can also make use of the synergy of the current and voltage sources fitted for other testing duties, such as $\mu\Omega$ measurement for example. It is true that this calls for a certain added complication to the hardware and software of the testing device, but this will change the weight and size of the testing device or tester to only an immaterial degree.

As has already mentioned, the control means of the testing device according to the invention are used to acquire both analog measurement signals and digital measurement signals. The digital measurement input of the control means according to the invention in particular is of special importance because the test-pieces to be tested with the testing device according to the invention are becoming increasingly complex and in future unconventional current converters for example will be provided with direct digital interfaces and will thus no longer supply, as they have done so far, an analog secondary current (of the order of between 1 A and 5 A for example) but will be connected via a bus straight to the relevant station services management system. The testing of such unconventional current converters (for polarity, for transformation ratio or for transient response for example) is not possible with the testers known at the moment.

BRIEF DESCRIPTION OF THE DRAWINGS

The present invention is explained in detail below by reference to a preferred embodiment and the accompanying drawing, wherein the FIGURE illustrates the component parts of a portable testing device forming a preferred embodiment of the present invention.

DETAILED DESCRIPTION OF PRESENTLY PREFERRED EMBODIMENTS

The single FIGURE shows the component parts of a portable testing device forming a preferred embodiment of the present invention, the components shown all being accommodated in a common housing. A switched-mode power amplifier 3, which performs the function of an electronically controllable power converter, is connected via a filter 2 to a voltage source 1, which in the present case may in particular be a connection to mains voltage. It is also conceivable for there to be a connection to a DC voltage source, e.g. in the form of a plurality of primary batteries or secondary storage batteries connected in series, to enable high currents and voltages to be generated even when there is no mains connection available, on a building site or the like for example.

Connected to the output of power amplifier 3 is the primary winding 4 of a matching transformer, which has a plurality of secondary windings 5–7 which can be changed over by means of controllable switches 11–13. Power amplifier 3 is controlled by a control which in the embodiment shown is formed by a digital signal processor 8 and a single-board computer or controller 9. A control signal from controller 9 switches the controllable switches 11–13 connected to the secondary windings 5–7 of the matching transformer. Digital signal processor 8 has connections which are shown, in the form of a digital interface for directly acquiring digital measurement signals or digital measured values. Also provided is an analog/digital converter or a plurality of analog/digital converters (connected in parallel) 10 which convert various analog measurement signals into corresponding digital data for the digital signal processor 8 or the controller 9.

The testing device shown in the FIGURE operates as follows.

A test-piece on which measurements are to be made, such as a current converter, a voltage converter or an over-current relay for example, is connected via a removable connection to a given secondary winding 5–7 of the matching transformer. Each secondary wing 5–7 defines a different transformation ratio, which means that there are different amplitudes of voltage and current at the outputs of each of the individual secondary windings 5–7. The testing device according to the invention may also be so designed that when a test-piece is connected to the testing device it is connected simultaneously to all or some of the outputs of the individual secondary winds 5–7. The secondary winding 5–7 which is to be active at the time is selected by closing the appropriate switch 11–13, which can be done manually (in the case of high output currents for example) or electronically by controller 9 by operating the latter as appropriate. The selective activation of one of the secondary windings 5–7 sets tee testing signal to be fed to the test-piece coarsely.

The testing signal is finely set by controlling power amplifier 3, in which case it is possible for the testing current or testing voltage to be freely programmed, in respect of its amplitude, phase shift or waveform for example, by means of digital signal processor 8.

To carry out different test sequences, special test procedures are stored, the digital signal processor 8 or the controller 9 operating power amplifier 3 and/or the matching transformer or rather the switches 11–13 on the secondary side as appropriate as a function of the test procedure selected at the time, so that a testing signal appropriate for the test procedure selected at the time or an appropriate sequence of testing signals can be generated and fed to the test-piece which is controlled[1].

Via the analog/digital converters 10, analog measurement signals which adjust themselves during a test sequence and which define certain measured parameters of the test-piece such as voltages, currents, phase angles, powers (active powers and reactive powers), resistances and the like are acquired, it being possible for both instantaneous values and RMS values to be measured. Magnetization curves can also be plotted for current converters or tripping times measured for over-current relays, etc. The measured parameters acquired by the analog/digital converters 10 are converted into corresponding digital measurements and are fed to digital signal processor 8 or controller 9 for analysis and storage. Digital signal processor 8 also has the additional digital interface shown in the FIGURE to enable measurements also to be made on test-pieces, which are provided with a direct digital interface.

The measurement signals acquired in this way are analyzed and logged by digital signal processor 8 in real time, which means that a stored test record is produced for each test carried out. In this case, the measurements are preferably inserted in the appropriate preset test procedure so that each test procedure forms a self-contained unit, which is used on the one hand as a test record and on the other as a master for carrying out other similar tests.

As shown in the FIGURE, the testing voltages or (via suitable current converters) testing currents arising at the secondary wings 5–7 of the matching transformer are also monitored by means of analog/digital converters 10 via feedback circuit 14–19, thus forming a regulating circuit, digital signal processor 8 or controller 9 comparing the actual value of the testing voltage or testing current from whichever secondary winding 5–7 is active at the time with a preset desired value and acting on power amplifier 3 in such a way that the amplitude of the particular testing current or testing voltage remains constant this is particularly important because the testing signal supplied by power amplifier 3 is dependent on the supply voltage provided by voltage source 1, the regulation which has been described thus enabling the particular testing current or testing voltage to be made independent of fluctuations in the supply voltage, which may be the mains voltage for example. Also, by actuating the regulating circuit, it is possible for the signal shape of the testing current which appears on the secondary winding 5–7 which is active at the time, or that of the testing voltage at the time, to be kept constant, so that a sinusoidal testing signal for example can be maintained even when the impedance of the test-piece which is connected up at the time is not linear.

As has already been mentioned previously, the testing signal generated by power amplifier 3, which is applied via matching transformer 4–7 to whatever test-piece is connected at the time, is derived from the supply voltage which is applied at the time, that is to say from the mains voltage if the portable testing device shown is connected to the mains. The result is that the testing signal generated at the time can be synchronized with the supply voltage. However, it is equally conceivable for the testing signal generated at the time to be synchronized with some other control voltage, which can be fed in internally or externally. This feature is particularly important when a plurality of the portable testing devices shown in the FIGURE are to be put into operation in the form of a testing system, each of the individual testing devices then generating a testing signal which is synchronous with the same signal or the same voltage, thus enabling the individual portable testing devices to be synchronized. The synchronizing signal involved may for example be a Global Positioning System ("GPS") signal.

As well as a plurality of portable testing devices according to the invention being synchronized as described above, it is also possible in a similar way for one portable testing device according to the invention to be synchronized with at least one other electronic testing device. The electronic testing devices concerned may in particular be ones that feed in testing currents and/or testing voltages at the secondary side of instrument transformers, at which side a standardized signal level is required. Such electronic testing devices, which operate at the secondary side, are generally signal generators that are able to generate relatively small testing signals.

As has already been mentioned previously, the components shown in the FIGURE are accommodated in a compact, portable housing. In a variant of the present invention, provision is however also made for the matching transformer 4–7 itself to be designed in the form of a portable unit, which is provided separately from the housing containing the remainder of the components and which can be connected by its primary winding 4 to power amplifier 3. This variant is advantageous because matching transformer 4–7 can then be positioned and connected to the test-piece in the immediate vicinity of the latter, thus allowing the high-current leads required to feed the testing signal to the test-piece to be kept short and even very high testing currents thus to be produced.

In a further variant of the present invention, provision is made for harmonics or non-sinusoidal signals to be fed in by controlling power amplifier 3 in the appropriate way with the help of digital signal processor 8 or controller 9, in order for example to allow the response characteristic of current or voltage converters at high frequencies to be measured.

It is particularly advantageous if, by controlling power amplifier 3 in the appropriate way with the help of digital signal processor 8 or controller 9, the testing signal generated is an AC voltage signal whose half-waves have a non-symmetrical signal shape or a non-symmetrical signal waveform. The signal may for example be a sawtooth signal with different rising and decaying edges. For this purpose it is equally conceivable for the fundamental waveform of the testing signal to have other signals, harmonics or pulses for example, superimposed on it in order to provide the positive or negative-going half-wave of the testing signal with an appropriate identifier. By analyzing the measurement signal which is set up as a result of this testing signal, i.e. by analyzing the non-symmetry of the measurement signal or the harmonics or pulses it has, it is possible for the whole of the wiring, and particularly that of current and voltage converters and protective devices, to be tested.

One point that will explicitly be made is that the methods described above of generating particular testing signals, and especially the last method described for generating a non-symmetrical testing signal for testing the polarity of the whole of a set of wiring, can also be used in other testing devices independently of the present invention. Particularly in connection with the last method described for generating a non-symmetrical testing signal for testing the polarity of the whole of a set of wiring, it is conceivable for the non-symmetrical testing signal to be generated by a given testing device and the non-symmetry of the measurement signal or of the corresponding harmonic signal to, or of the corresponding pulses in, the measurement signal to be analyzed with the help of an additional receiver to enable the polarity of the whole of the wiring to be tested. The receiver involved may in particular be a battery-operated receiver in a separate housing which can thus easily be connected to the point at which it is desired to make measurements.

What is claimed is:

1. A portable testing device comprising
   a controllable converter device for connection to a source of supply voltage,
   a matching transformer connectable to the controllable converter device, the matching transformer having a plurality of switchable secondary windings for removably connecting thereto a test the test piece being operable at high voltages and/or high currents and
   control means for controlling the controllable converter device so as to generate a desired testing signal to test the test-piece removably connected to the matching transformer, and for receiving at least one measurement signal that defines at least one measurement parameter of the test piece in response to the generated testing signal, wherein the controllable converter device, the matching transformer and the control means are included within at least one portable unit.

2. The portable testing device according to claim 1, wherein the controllable converter device comprises a switched-mode power amplifier.

3. The portable testing device according to claim 1, wherein the control means comprise a digital signal processor.

4. The portable testing device according to claim 1, wherein the control means comprises a processing device selected from the group consisting of a computer and a controller.

5. The portable testing device according to claim 1, wherein the control means comprise a digital interface for receiving a digital measurement signal.

6. The portable testing device according to claim 1, wherein the control means comprise an analog interface for receiving an analog measurement signal.

7. The portable testing device according to claim 1, wherein the controllable converter device is designed for connection to a source of mains voltage.

8. The portable testing device according to claim 1, wherein the controllable converter device is designed for connection to a source of PC voltage.

9. The portable testing device according to claim 1, wherein the control means are designed to automatically change over the secondary windings of the matching transformer.

10. The portable testing device according to claim 1, wherein the control means comprise storage means for storing measurement results obtained as a result of a test on the test-piece.

11. The portable testing device according to claim 10, wherein an interface is provided for external downloading of the measurement results stored in the control means.

12. The portable testing device according to clam 1, wherein the control means are so designed that they automatically control the controllable converter device and automatically change over the secondary windings of the matching transformer as a function of a preset test procedure to enable a test sequence corresponding to the test procedure to be carried out automatically.

13. The portable testing device according to claim 12, wherein the control means are so designed that they automatically insert and store as a test record a measurement result obtained as a result of a test sequence in the test procedure the test procedure being adapted for used as a master for at least one later test sequence.

14. The portable testing device according to claim 1, wherein the controllable converter device, the matching transformer and the control means are all accommodated in a common housing to form a portable unit.

15. The portable testing device according to claim 1, wherein the controllable converter device and the control means are accommodated in a common housing to form a first portable unit, whereas the matching transformer is designed to form a second portable unit and is to be connected to the controllable converter device.

16. The portable testing device according to claim 1, wherein the control means are so designed that they detect and analyze parametric values of the testing signal arising in the secondary windings of the matching transformer and control the controllable converter device in such a way that the parametric values of the testing signal are regulated to a given desired value.

17. The potable testing device according to claim 1, wherein the control means are so designed that they detect the signal shape of the testing signal arising in the secondary windings of the matching transformer and control the controllable converter device in such a way that the testing signal is regulated to a given desired signal shape.

18. The portable testing device according to claim 1, wherein the control means are so designed that, to test the test-piece for its response characteristic, they control the controllable converter device in such a way that the testing signal is generated with harmonics or with a non-sinusoidal component.

19. The portable testing device according to claim 1, wherein the control means are so designed that, to test the polarity of the wiring of the test-piece, they control the controllable converter device in such a way that a testing signal which is non-symmetrical in respect of its half-waves is generated.

20. The portable testing device according to claim 1, wherein the controllable converter device generates the testing signal to be emitted via the matching transformer synchronously with a given reference signal.

21. The portable testing device according to claim 20, wherein the reference signal is formed by a supply voltage provided by the source of supply voltage.

22. A portable testing system having a plurality of portable testing devices according to claim 20, the portable testing devices being so designed that the individual controllable converter devices of the individual portable testing devices generate their particular testing signal synchronously with one and the same reference signal.

23. The portable testing system according to claim 22, wherein the common reference signal for the individual portable testing devices is any of a common mains voltage, a common control signal and a GPS signal, which is fed to the individual portable testing devices.

24. The portable testing system according to claim 22, wherein at least one of the portable testing devices is synchronized with at least one other electronic testing device which is designed to generate a testing signal to be fed in at the secondary side of an instrument transformer.

* * * * *